United States Patent
Savas

(10) Patent No.: US 7,534,362 B2
(45) Date of Patent: May 19, 2009

(54) UNIFORM ETCHING SYSTEM AND PROCESS FOR LARGE RECTANGULAR SUBSTRATES

(76) Inventor: Stephen E. Savas, 1425 Koll Cir., Suite 111, San Jose, CA (US) 95112

( * ) Notice: Subject to any disclaimer, the term of this patent is extended or adjusted under 35 U.S.C. 154(b) by 74 days.

(21) Appl. No.: 11/180,294

(22) Filed: Jul. 13, 2005

(65) Prior Publication Data

US 2006/0011581 A1    Jan. 19, 2006

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |

(52) U.S. Cl. ..................... 216/58; 427/248.1

(58) Field of Classification Search ............... 216/58, 216/67; 156/345.34; 219/121.43; 438/710; 118/715, 723 E, 62, 63; 427/248.1
See application file for complete search history.

(56) References Cited

U.S. PATENT DOCUMENTS

| | | | | |
|---|---|---|---|---|
| 5,198,634 | A * | 3/1993 | Mattson et al. | ......... 219/121.43 |
| 5,532,190 | A * | 7/1996 | Goodyear et al. | ............ 438/710 |
| 5,853,484 | A * | 12/1998 | Jeong | ........................ 118/715 |
| 6,830,624 | B2 * | 12/2004 | Janakiraman et al. | ........ 118/715 |
| 2005/0014382 | A1 * | 1/2005 | Lee et al. | .................... 438/706 |

* cited by examiner

Primary Examiner—Roberts P Culbert

(57) ABSTRACT

Apparatus and process for controlling etching of silicon-based or organic materials on large rectangular substrates for manufacture of flat panel displays or other devices. The disclosed etching process can remove silicon-based materials or organic polymers with a rate distribution such that all areas of the panel are finished at nearly the same time. It does so while minimizing electrical charging of the workpiece that could cause damage to the devices. The etching chamber employs a parallel plate RF discharge between two electrodes, one of which is the showerhead for gas introduction and the other supports the substrate to be processed. Reactant and other gases are provided to the discharge by a novel showerhead structure. The gases which provide reactants for etching silicon-based materials include halogenated compounds. Oxygen, water vapor or hydrogen with other gas additives may be used for etching organic polymers. The uniformity of etching across the substrate is controlled by adding other gas(es), including inert diluents, which can control the etching rate for either silicon-based materials or organic materials by accelerating and/or decreasing it. In addition, the distribution of the gases which are added can be varied to make the surface potential of the substrate more uniform. With a showerhead having a single reservoir that feeds all gases into the discharge, the gases may be added to the reservoir through multiple distribution structures within or adjacent to the reservoir. These structures are each supplied separately with the additive gases and, in turn, feed them to the different regions of the reservoir. The invention can thus provide different etching rates for different parts of the substrate, as may be required to finish film removal in all areas of the panel at nearly the same time. The invention also provides for chemical conversion of inorganic residues remaining after the oxidation of an organic polymer in the ashing process by addition of small amounts of halogenated gas(es) to the mixture flowing through the plasma sources. With the system and process of the invention, space efficiency, operating cost and capital cost for making large substrates can be reduced significantly.

7 Claims, 4 Drawing Sheets

The Structure for Introducing Additive Gases

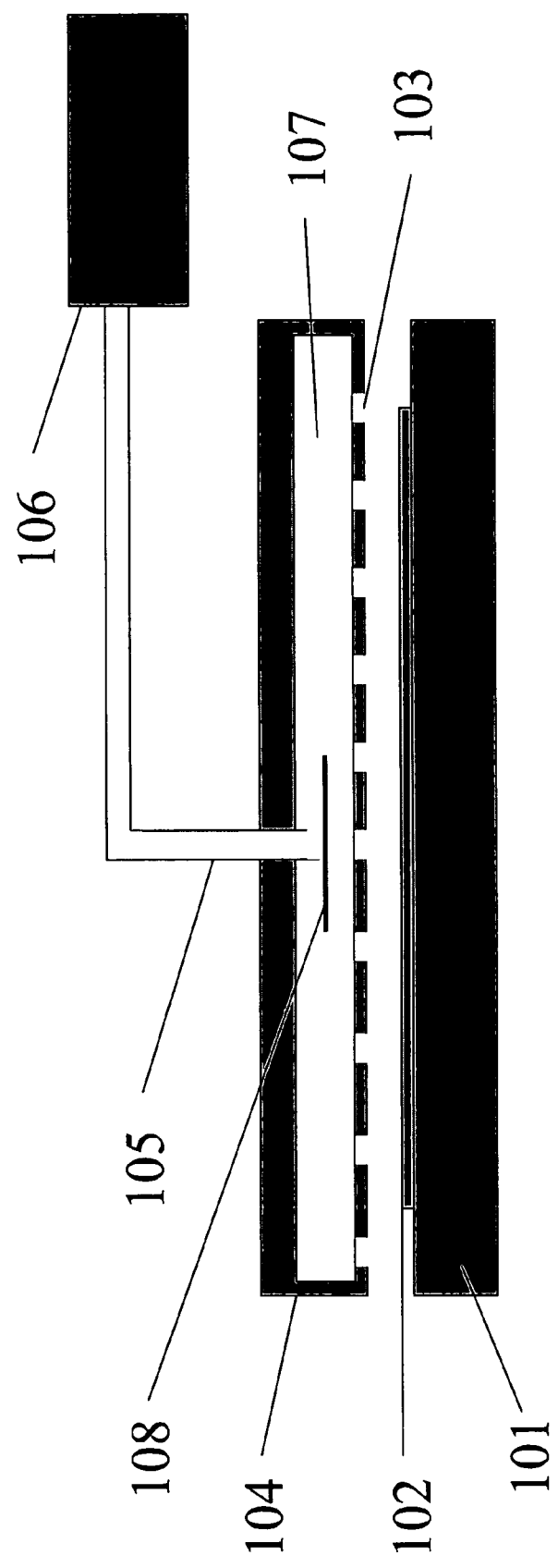
Figure 1 – Typical Parallel Plate Etching Reactor

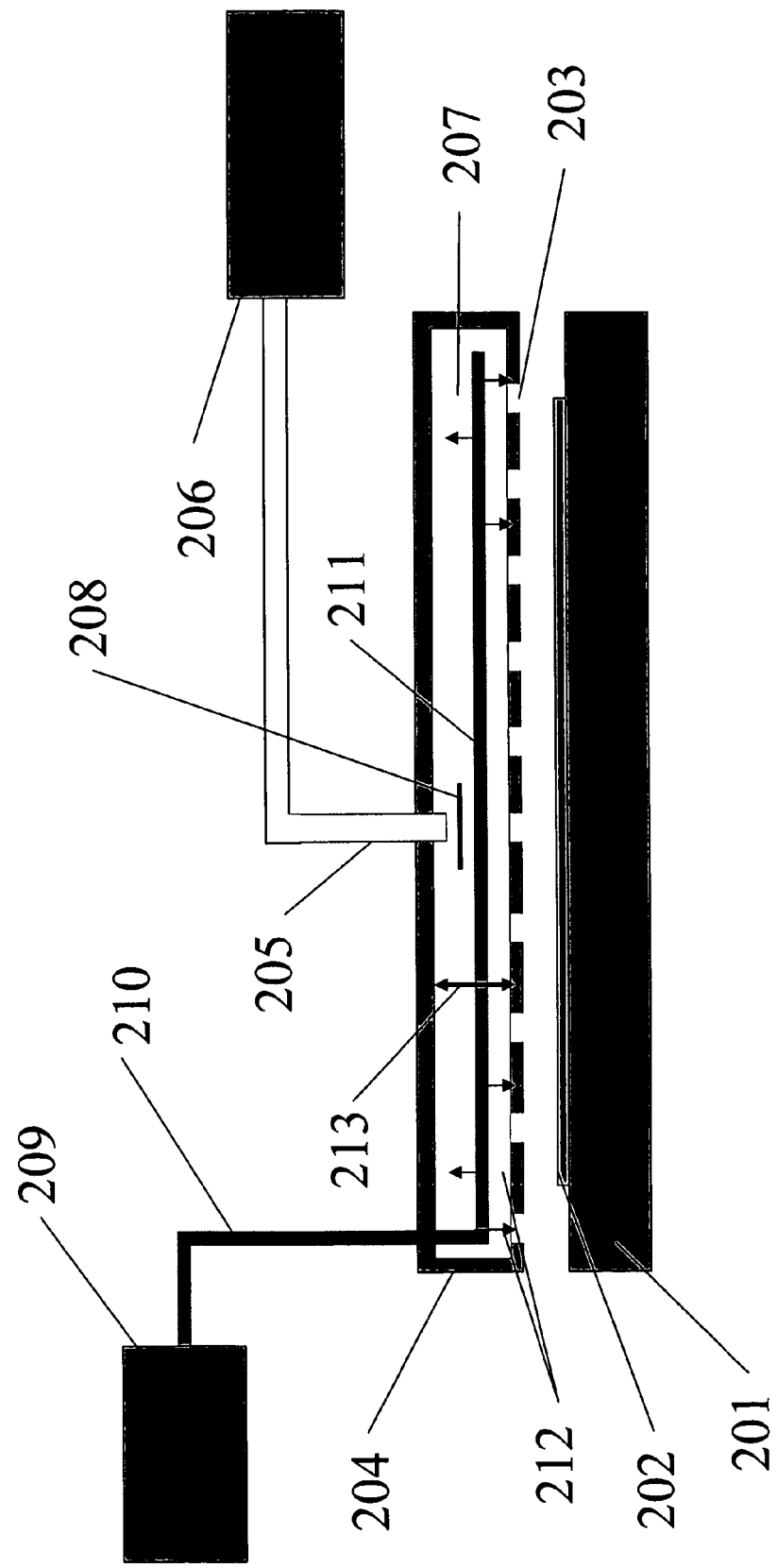
Figure 2 – The Structure for Introducing Additive Gases

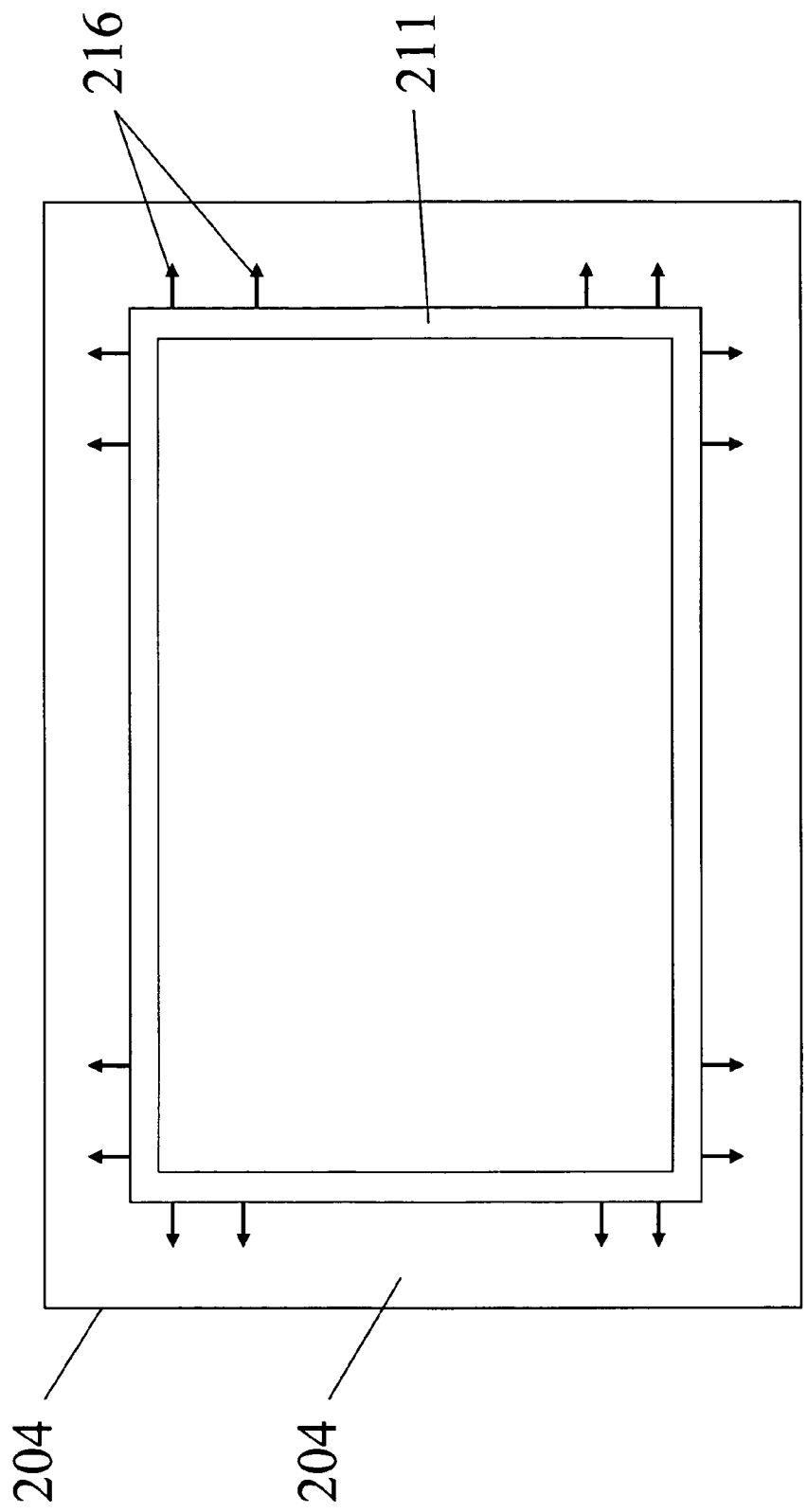
Figure 3 – Top View of Injection Pattern for Additive Gases

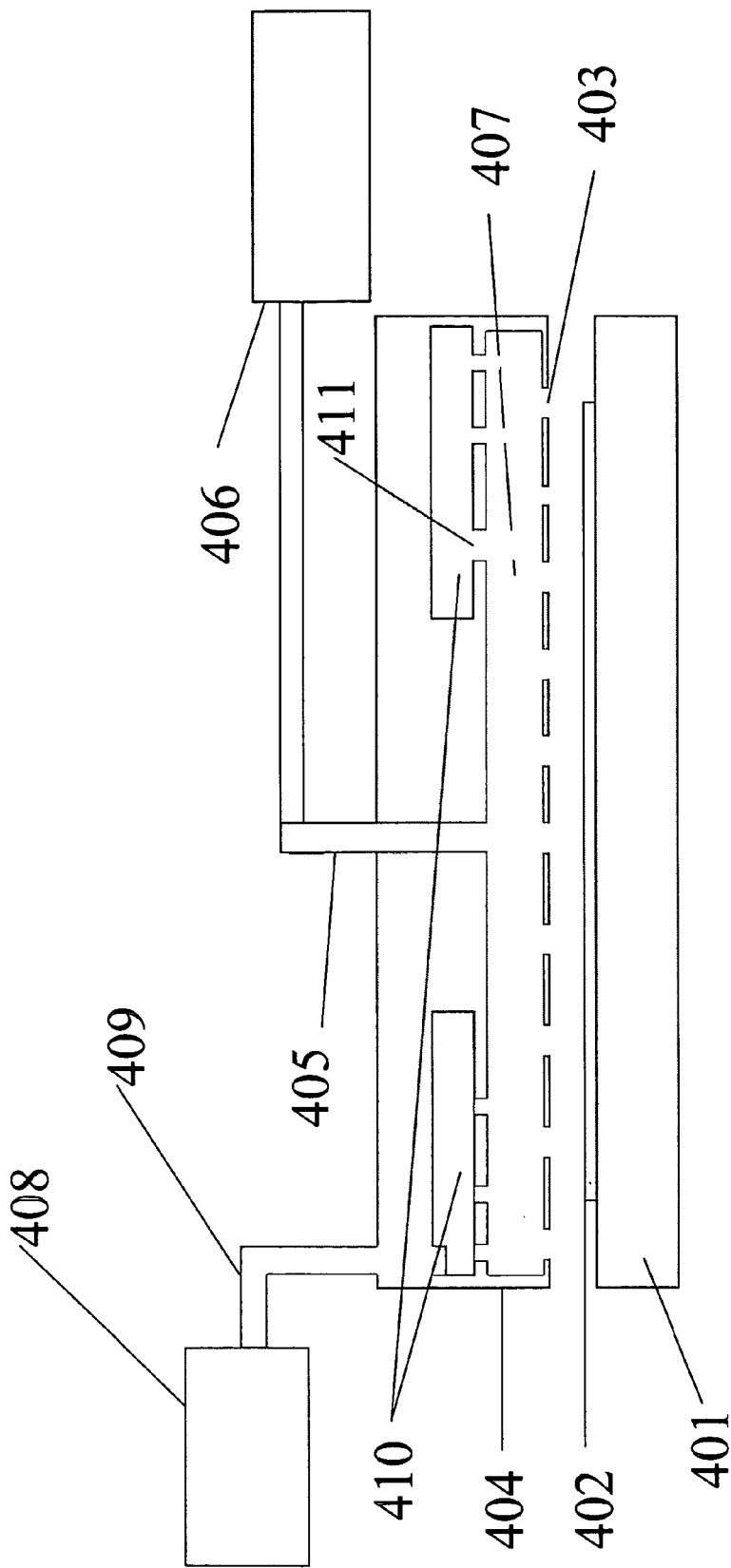
Figure 4 – Supplemental Reservoir Adjacent to Primary

UNIFORM ETCHING SYSTEM AND PROCESS FOR LARGE RECTANGULAR SUBSTRATES

BACKGROUND OF THE INVENTION

1. Field of Invention

This invention pertains to a novel apparatus and process for controlling etching of silicon-based or organic materials on large rectangular substrates for manufacture of flat panel displays or other devices.

2. Related Art

There are many significant technical problems with scaling well-known methods for dry etching and photoresist ashing to the very large substrates such as fifth generation TFT/LCD (thin film transistor liquid crystal display) flat panel substrates or large solar panels. The best-known and least expensive approach for etching is with parallel plate, RF discharges such as have been used for decades in manufacturing integrated circuits. For ashing in IC manufacturing the proven parallel plate resist stripping method found in U.S. Pat. No. 5,189,634 was able to achieve good results and productivity for 200 mm wafers. However, with increasing substrate size and a rectangular shape, it is increasingly difficult to achieve the uniformity of rate needed for good device yields.

In addition, RF plasma discharge processes are likely to cause substantial electrical potential variations across the surface of the larger substrates. Such potential differences typically increase as the size of the substrate increases and also worsen as non-uniformities in the process increase. Such potential variations can cause electrical stress damage to components being fabricated on the substrate.

Also, the etching rate may have a strong dependency on the gap between the electrodes. Therefore, any variation in the spacing between the showerhead and pedestal is likely to cause non-uniformity in the etching rate, and can also cause substrate-charging problems as well. With large showerheads or pedestals, maintaining a high degree of flatness after processing large numbers of substrates may be very challenging, and the problem is compounded because the relationship between electrode gap and etch rate is non-linear. Areas with a smaller gap have lower impedance to RF current flow, and the increased current flow results in increased power deposition and increased conductivity in such areas. That, in turn, causes even further increase in RF current density in the areas.

Heretofore, etching rate variations and, to a lesser extent, surface potential variations have been minimized by varying the mixture of gases, pressure, RF power, and the spacing between the showerhead and substrate supporting pedestal. This approach has provided adequate uniformity for many generations of integrated circuit fabrication technology on silicon wafers with wafer diameters from 3" to 12". However, good uniformity of etching rate has become increasingly difficult as the substrate or wafer size has increased. Getting good uniformity of surface potential has been very difficult even for round wafers of limited size, and remains a significant challenge with this type of etching technology. For the larger and larger rectangular substrates used for making TFT/LCD screens, it has not been possible to achieve satisfactory uniformity of etch rate by scaling up the traditional etching processes.

U.S. Pat. No. 5,532,190 shows a showerhead in which the reservoir is divided into concentric segments in order to achieve a more uniform etch rate. That approach is pretty much limited to round wafers, and it does not address the issue of uniform substrate surface potential which is very important for achieving good yields in devices having thin, sensitive dielectric layers. The concentric segmentation is better suited for round substrates with a symmetric radial flow pattern than it is for rectangular substrates where flow patterns near the corners are more complex and not simply outward from the center of the substrate. Gas flow is not constant in direction as it moves toward corners of a rectangular substrate, and that causes total gas flow to the corners to be reduced. Hence, concentric segmentation would not be very effective with a rectangular substrate.

Applying feedback control of reactant gas flow as suggested by U.S. Pat. No. 5,853,484 to a rectangularly segmented showerhead would require a minimum of 9 segments to distinguish between center region and corners. That would require 9 separate monitoring devices for determining the rates of etching in the 9 different segmented areas of the substrate and 9 sets of gas flow controllers for the gases to be supplied through the showerhead to the plasma for the different segments. Furthermore, increasing the flow for any of the segments would affect the total flow pattern between the electrodes and thereby influence the etching rates on all of the other segments. That means that a very complex, iterative adjustment scheme would be needed to actually accomplish the adjustment of the rates desired. Use of such a rate adjustment method and apparatus would increase cost and complexity of the device and still not be likely to be successful due to the variation of the rate across the area of each of the segments. To be successful, such an approach would require a very large number of segments, possibly 25 or more, and would be prohibitively expensive.

OBJECTS AND SUMMARY OF THE INVENTION

It is, in general, an object of the invention to provide a new and improved apparatus and process for controlling etching of silicon-based or organic materials on large rectangular substrates for manufacture of flat panel displays or other devices.

Another object of the invention is to provide an apparatus and process of the above character which overcome the limitations and disadvantages of the prior art.

These and other objects are achieved in accordance with the invention by providing a showerhead that provides improved control of the uniformity of etching rate and/or substrate surface electrical potential in an etching or substrate cleaning reactor utilizing an rf discharge between substantially parallel plates for processing large rectangular substrates. The showerhead includes a reservoir connected by a plurality of small holes to the volume between the plates wherein the discharge is sustained, two or more gas injection manifolds connected through flow controlling means to supplies of different process gases or mixtures, with each of the two or more gas injection manifolds having a different spatial pattern of members, and different distribution of openings for releasing gas or mixture of gases that they carry into the volume of the reservoir with differing spatial and or temporal distributions.

BRIEF DESCRIPTION OF THE DRAWINGS

FIG. 1 is a cross-sectional view, somewhat schematic, of a parallel plate etching reactor of the prior art.

FIG. 2 is a cross-sectional view, somewhat schematic, of one embodiment of an etching reactor incorporating the invention.

FIG. 3 is a top plan view, illustrating the injection pattern for additive gases in the embodiment of FIG. 2.

FIG. 4 is a cross-sectional view, somewhat schematic, of another embodiment of an etching reactor incorporating the invention.

DETAILED DESCRIPTION

It has been observed that the etching rate across the large substrate varies in a reasonably well-behaved manner except at or near its corners. It has also been found that both the etching rate and the surface potential on the substrate must be adjusted to achieve good uniformity for many types of substrate manufacturing technologies, and that inert gases or other gases which do not greatly affect etching rate can affect the electrical potential on the panel surface. The invention provides a practical, relatively low cost apparatus and process for reducing the variation of both etching rate and surface potential across a large substrate.

In parallel plate discharges for etching, where the showerhead for introducing gas(es) also serves as one of the electrodes, there has normally been a single primary reservoir feeding the gas mixture to the holes through which it flows into the discharge volume. This reservoir covers an area within the showerhead that extends on all sides beyond the area of the substrate to be processed. The purpose of the reservoir is to distribute the gas equally behind the injector holes so that flow of gas into the discharge is uniform across the holes and the flow speed of the gas in the direction across the holes is low. This has led to a number of schemes for injecting gas into the reservoir.

See FIG. 1 for a schematic of the typical parallel plate discharge processing system. In this Figure, the pedestal, 101, holding the substrate, 102, is parallel to a showerhead electrode, 104, which has a reservoir within it, 107, for holding a gas which is injected from there into the discharge volume through small holes, 103. The gas is supplied from a source, 106, which usually includes metering valves through a tube, 105, into the reservoir. There is often a baffle, 108, such as a simple disk which blocks direct flow of the gas so that the jet of gas from the tube, 105, does not cause increased flow through the holes which are directly in its path. There may also be a manifold within the reservoir which feeds gas more evenly to the volume of the reservoir.

In one embodiment of the invention we introduce additional gas injector or injectors within the reservoir. In one embodiment this consists of a perforated tube or a number of perforated tubes that may distribute supplemental gas(es) into the primary reservoir. See FIGS. 2 and 3 for Schematic views of an additional gas injector. Such gases may include those for accelerating or for decreasing the etching rate, or for affecting the substrate surface electrical potential. The flows of the supplemental gases, controlled by their own set of flow rate controllers, may then be varied independently of the flows of the main etching reactant gas(es) injected into the reservoir. Such injectors, by suitably locating their position and perforations, can take advantage of the symmetry of the substrate. In the case of rectangular substrates, where there are four corners that tend to receive reduced amounts of reactant, one additional injector could direct supplemental gas to all the corner regions, and only there, to boost the etching. If the etching rate also needs to be increased or decreased in greater or lesser degree in other regions (in the case of a rectangular substrate there would be two or four such regions) a second injector could symmetrically distribute the gases into those regions of the reservoir only.

In such a design the supplemental gas injector manifold(s) could be adjusted in position or the pattern of their holes, iteratively if necessary, to adjust the etching rate in that region and make it more uniform. This may be done without other changes to the showerhead structure or reservoir. It is possible to make the depth of the reservoir greater or lesser in order to control the extent to which the supplemental gases spread out prior to flowing into the discharge volume. In general, making the depth of the reservoir smaller will reduce the extent of such spreading or diffusion prior to flow into the discharge.

In an alternative embodiment the gas injector(s) can also be in the form of a secondary or adjacent reservoir behind the primary reservoir and separated from it by a permeable or perforated barrier. See FIG. 4 for a Schematic of one Adjacent Reservoir as it introduces additive gases into the primary reservoir. Appropriate choice of the hole pattern in either of the structures for introduction of the additive gases into the primary reservoir can be made by testing the optimized uniformity pattern for etching rate or for electrical potential on a substrate. Once the non-uniformity of either property has been measured it could be adjusted by a process of iteration, making suitable adjustments in the hole pattern so as to affect the spatial distribution of the additive gases. In one embodiment for rectangular substrates, the additive gases to be introduced near the corners could accelerate the etching rate in this region by 10% to as much as 50%.

Such accelerating gases for etching of silicon or silicon containing materials might include oxygen ($O_2$ or $N_2O$) for primary etching gases which are fluorinated gases such as fluorocarbon gases ($CF_4$, $C_2F_6$, $C_3F_8$, $CHF_3$) and partially hydrogenated fluorocarbon gases. Rate decreasing gases for etching of silicon and compounds might include hydrogen-containing gases such as $CH_4$, $C_2H_6$, and other hydrocarbons. Other rate decreasing gases might include nitrogen, ammonia, alcohols or hydrogen-cyanide. Etch rate accelerating gases for etching organic polymers might include nitrogen gas ($N_2$) in small amounts, Fluorine containing gases (e.g., $SF_6$, $C_2F_6$, $NF_3$ and the like), water vapor or $N_2O$. Rate decreasing gases for etching organic polymers might include hydrogen and/or carbon-containing gases such as hydrocarbons and other volatile organic compounds including alcohols, ammonia, or diluents such as helium or argon. Additive gases for reducing the surface potential might include argon or helium. Additive gases for increasing the surface potential might include nitrogen, carbon dioxide or highly electronegative gases such as $SF_6$ or $CL_2$.

In both the cases of the additional injector structures or adjacent injector the means for injecting additive gases into the primary etching gas(es) are able to inject that gas into the primary reservoir so that it mixes with the etching gas(es) before that mixture flows into the discharge volume. This mixing avoids reliance upon mixing of the additive gases within the discharge. Inadequate mixing might cause anomalous behavior of the discharge in regions were such additive gases directly injected. It also avoids having to control additional flows of the etching gases into those regions where additive gases were also to be used, such as in Goodyear or Jeong. Thus, the disclosed invention is better and less expensively able to improve etching rate uniformity than the prior art types of apparatus. Further, the invention we disclose is able to address and remediate the non-uniformity of the surface electrical potential on the substrate that can have a serious adverse impact on the yield of devices. The supplemental gas(es) injected from the additional injector(s) mix with the primary injected gas(es) prior to injection into the discharge. Generally, there will be a flow pattern of the primary gas(es) which depends on the way that gas(es) is/are injected into the primary reservoir. Such primary gas(es) may be injected by means such as shown in FIG. 2 where the injection is central in the primary reservoir or by an injector tube having perforations. In the case of the central injector the primary gas bulk motion is generally outward from the point of introduction. In this case any supplemental gas(es) introduced by additional injector(s) will mix with and flow with the primary gas(es) after introduction into the primary reservoir. Choice may be made of an injection means for the primary gas(es) into the primary reservoir so as to provide this gas more locally from an injector manifold within the primary reservoir. In this case there may be less of the bulk motion of the primary gas(es) which may cause the supplemental gas to be less widely dispersed within the primary reservoir prior to flowing into the discharge.

Generally, the hole pattern in the additional gas injector(s) may be chosen to suitably mix and disperse the supplemental gas(es) so that they are appropriately distributed in the desired area of the primary reservoir.

In FIG. 2 we see the pedestal, 201, which supports the substrate, 202, facing the holes in the showerhead, 203, through which gas injected into the discharge. The showerhead structure, 204, contains the primary reservoir, 207, into which gas is injected from the supply, 206, via the tubing, 205. The baffle 208 helps properly distribute the gas injected into the primary reservoir so it may evenly flow to all regions of the reservoir. Also within the showerhead structure is the additive gas injector, 211, which is fed gas from supply/controller, 209, via the tubing, 210. The injected additive gas is shown as arrows such as those labeled 212. The depth dimension of the primary reservoir is indicated by the double sided arrow 213. Note that the gas from the additional injector is not injected uniformly but rather in this case is injected only at the corners of the reservoir—which can be seen better in the top view of FIG. 3. For example, in a showerhead for a rectangular substrate the injection structure for the additive gases may be a tube which makes a circuit at a small distance from the outer edge of the primary (approximately rectangular) reservoir. In this case the holes in this distribution tube would direct supplemental gas to the region of the corners of the rectangular primary reservoir so that the additive gases are more concentrated near the corners of the substrate. See FIG. 3 for a top view of the distribution tube for additive gases within the primary reservoir. In the figure the supplemental injection structure, 301, lies within the primary reservoir, 302, and has injection pattern indicated by arrows such as shown in 303.

In FIG. 4 we show an alternative embodiment of the invention where an injector for supplemental gas(es) is a secondary reservoir behind the primary reservoir. If desired there may be a multiplicity of such secondary reservoirs which may cover as much as virtually the entire primary reservoir's area. The pedestal, 401, for holding the substrate, 402, is evenly spaced from the showerhead, 404, in which injection holes, 403, permit gases to enter the discharge. The primary gas or gas mixture is supplied by gas flow controller(s), 406, via tube(s), 405, to the primary reservoir, 407. The primary reservoir may, in this embodiment, be fed supplemental gas(es) from an adjacent secondary reservoir, 410, which is supplied separately with supplemental gas(es) by a separate controller, 408, via a tube, 409. The barrier between secondary and primary reservoirs has one or more holes, 411, that distribute the supplemental gas(es) into the primary reservoir to mix with the primary gas(es) before injection into the discharge.

It is apparent from the foregoing that a new and improved apparatus and process for controlling etching of silicon-based or organic materials on large rectangular substrates have been provided. While only certain presently preferred embodiments have been described in detail, as will be apparent to those familiar with the art, certain changes and modifications can be made without departing from the scope of the invention as defined by the following claims.

The invention claimed is:

1. A method for improving process uniformity in a etching or substrate cleaning reactor utilizing an rf discharge between substantially parallel plates, one of which is a showerhead with a primary internal gas reservoir, greater in area and corresponding in shape to the substrate and connected to the plasma region adjacent the substrate by small holes, for processing large non-circular substrates, comprising the steps of:

providing a rate adjustment gas or gas mixture, through openings in a manifold or manifolds disposed within the edge and/or corner regions of the reservoir, for improving the spatial uniformity of the process, introduced by separate controllable means into the edge and/or corner regions of the showerhead reservoir in addition to a main process gas or mixture introduced into that same reservoir so that the rate adjustment gas or gas mixture combines and mixes with the main process gas or gas mixture within the reservoir in the showerhead, having higher concentration in the edge and corner regions therein, and the combined gases flow into the plasma discharge between showerhead and substrate:

the rate adjustment gas or gas mixture fed into the plasma causing an increase or decrease of the processing rate on the substrate roughly proportional to the local concentration of said adjustment gas or gas mixture coming into the plasma; and preferentially increasing the processing rate in the regions of the substrate corresponding to those locations within the showerhead where the adjustment gas or mixture is preferentially introduced.

2. The method of claim 1 wherein the rate adjustment gas or gas mixture is an accelerant of the processing rate, and it is introduced preferentially in locations within the reservoir corresponding to those places on the substrate where the processing rate with the primary gas or gas mixture alone is found, without use of such accelerant, —to be less than the average.

3. The method of claim 2 wherein the accelerant gas or gas mixture is introduced via manifolds which have openings chosen for appropriate spatial distribution of the accelerant gas, in locations within the showerhead proportional to the deficit of the processing rate at corresponding places on the substrate.

4. The method of claim 1 wherein the gases flow into the plasma discharge through a plurality of small holes in the showerhead.

5. A method for improving process uniformity in an etching or substrate surface treatment reactor that employs an rf discharge between two planar electrodes, one of which is a showerhead with a single internal gas reservoir, corresponding in shape to the substrate, for processing large non-circular substrates, comprising the steps of:

injecting a primary gas or mixture of gases at a controlled rate into the reservoir within the showerhead, through injectors or manifold placed within the reservoir, also injecting into the same reservoir, with a flow rate controlled and lower than that for the primary gas or gas mixture, through one or more secondary manifolds disposed adjacent to or within the reservoir, an additive accelerant gas or gas mixture which, following injection, mixes with the primary gas or gas mixture within the reservoir, such that the concentration of the additive accelerant is highest in corners and/or edges of the reservoir, and as this mixture flows from the reservoir into the discharge region that this increases the processing rate for the parts of the substrate corresponding to those regions of the reservoir, resulting in reduced process non-uniformity across the substrate.

6. The method of claim 5 such that the additive accelerant gas or gas mixture is injected at a controlled flow rate by two secondary manifolds, one of which injects it at a controlled rate through small holes in that manifold directly into the corner regions, while the other secondary manifold with separate flow control injects the additive gas or mixture through small holes directly into the edges of the reservoir, thus enabling different concentration of accelerant in the gas mixture in those regions within the reservoir and thereby independent enhancement of the processing rate in the corners of the substrate from that at its edges.

7. A method for improving process uniformity in an etching or substrate surface treatment reactor that employs an rf discharge between two planar electrodes, one of which is a showerhead with a primary internal gas reservoir, greater in area and corresponding in shape to the substrate and connected to the plasma region adjacent the substrate by small holes, for processing large non-circular substrates, comprising the steps of:

injecting a primary gas or mixture of gases at a controlled rate directly into the primary reservoir within the showerhead, predominantly through injectors or manifold, and also injecting, with a flow rate controlled and lower than that for the primary gas or gas mixture, into one or more secondary reservoir(s) located adjacent the primary reservoir opposite the holes in the primary reservoir leading to the plasma, an additive accelerant gas or gas mixture which following injection mixes with the primary gas or gas mixture within the primary reservoir, such that the concentration of the additive accelerant is higher at the edges and/or corners of the primary reservoir than at the center, and as this mixture flows from the primary reservoir into the discharge region that this increases the processing rate for the parts of the substrate closest to those regions of the reservoir, resulting in reduced process non-uniformity across the substrate.

* * * * *